United States Patent [19]

Nakamura

[11] Patent Number: 4,681,288
[45] Date of Patent: Jul. 21, 1987

[54] FIXING COMPONENT

[75] Inventor: Toshinobu Nakamura, Tokyo, Japan

[73] Assignee: Shinagawa Shoko Co., Ltd., Tokyo, Japan

[21] Appl. No.: 772,459

[22] Filed: Sep. 4, 1985

[51] Int. Cl.⁴ ............................................. B65D 67/02
[52] U.S. Cl. ........................................ 248/71; 248/73; 248/221.4; 24/453; 24/628
[58] Field of Search ............ 248/71, 73, 221.4; 24/297, 326, 453, 625, 628

[56] References Cited

U.S. PATENT DOCUMENTS

| 3,154,281 | 10/1964 | Frank | 248/71 |
| 3,210,030 | 10/1965 | Ramsey | 248/71 |
| 3,991,960 | 11/1976 | Tanaka | 248/73 |
| 4,470,178 | 9/1984 | Matsui | 24/297 |
| 4,524,494 | 6/1985 | Sato | 24/297 |
| 4,564,163 | 1/1986 | Barnett | 248/71 |
| 4,566,660 | 1/1986 | Anscher | 24/453 |

Primary Examiner—J. Franklin Foss
Assistant Examiner—Robert A. Olson
Attorney, Agent, or Firm—Franklin D. Wolffe; Morris Fidelman

[57] ABSTRACT

A fixing component comprising a holder for holding other components, a resilient seat connected to the holder and having free ends contacting the surface of the board, a column projecting from the center of the seat through a hole in the board, and resilient wings diverging from a free end of the column, wherein a pair of extensions contacting the inner surface of the hole are provided on the seat.

4 Claims, 15 Drawing Figures

FIG. 7 FIG. 8
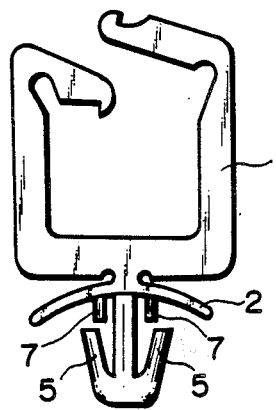 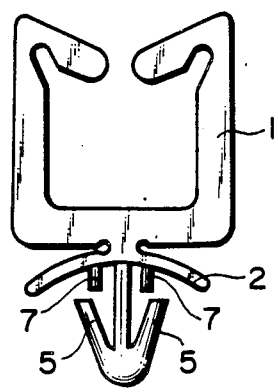
FIG. 9 FIG. 10
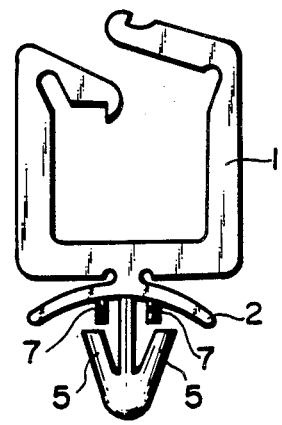 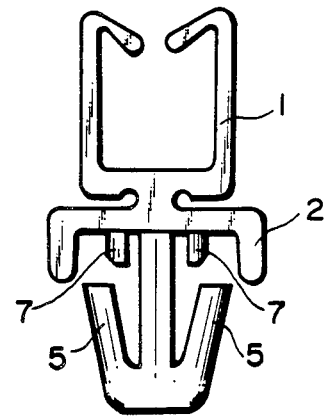

FIG.14
FIG.15
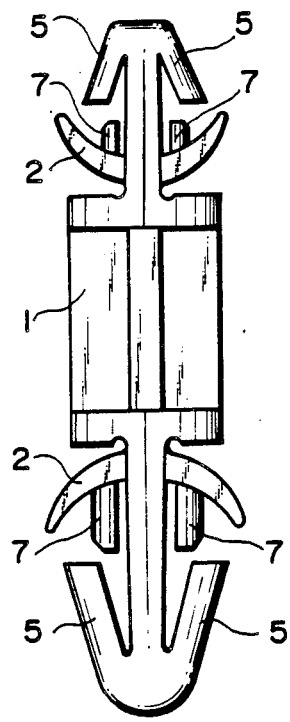
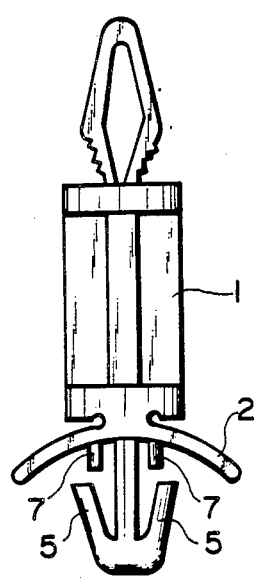

FIXING COMPONENT

BACKGROUND OF THE INVENTION

This invention relates to an improvement in multipurpose fixing components for use in assembly and wiring of an electric or electronic apparatus, particularly in bundling and holding wires, fixing printed circuit boards to a chassis thereof in a spaced relationship, and in fixing and spacing printed circuit boards relative to each other.

A conventional fixing component presented heretofore for this purpose is shown in FIGS. 1 and 2.

In these figures, a reference numeral 1 denotes a holder portion having a shape suitable for bundling and holding wires on a circuit board, while a numeral 2 denotes a web-like resilient seat portion which is connected to the holder portion integrally therewith and curved toward an apertured circuit board 3 to form an arch, with opposite free ends thereof held in contact with the surface of the circuit board. A numeral 4 denotes a column portion having a length such as to project from the center of the resilient seat portion through a circular hole 3a in the circuit board. A numeral 5 denotes a pair of resilient wing portions having free ends and diverging from a free end of the column portion to the outer circumference of the circular hole of the circuit board, and numeral 6 denotes extensions extending from respective free ends of the wing portions such as to contact the inner peripheral surface of the circular hole of the circuit board. As shown in FIG. 2, when the column portion 4 and the pair of resilient wing portions 5 are protruded through the circular hole 3a of the circuit board to the reverse side thereof, the arch-shaped resilient seat portion is opened or spread out with its free ends contacted to the surface of the circuit board, causing a spring force, which presses the free ends of the pair of wing portions against the surface of the circuit board around the hole, and makes the extensions 6 contact to the inner peripheral surface of the circular hole 3a. Thus, the fixing component is perpendicularly held to the circuit board in the hole thereof.

The fixing components constituted in the above manner is also arranged such that the component can be perpendicularly held in the circuit board by only one setting action and is prevented from shifting out of its proper position, but, in the circular hole 3a, between the column 4 and the extension 6 positioned on opposite sides thereof, necessary gaps are left, which give such an instability to the column 4 as to shift sidewards in the gaps, which results in some unreliableness of this fixing component.

SUMMARY OF THE INVENTION

The present invention has been made in consideration of eliminating the defect of the above fixing component and has a primary object of providing a fixing component having advantage of the above conventional fixing component and stability largely improved.

A fixing component according to the present invention is characterized by a constitution comprising a holder portion having a shape suitable for holding other components, a web-like resilient seat portion connected to the holder portion, curved toward the surface of an apertured circuit board to form an arch and provided with opposite free ends contacting the surface of the circuit board, a column portion projecting from the center of the seat portion through a hole in the circuit board, and a pair of resilient wing portions having free ends and diverging from a free end of the column portion toward the outside of the hole in the circuit board, wherein a pair of extensions contacting the inner peripheral surface of the hole in the circuit board is provided on the resilient seat portion.

BRIEF DESCRIPTION OF DRAWINGS

FIGS. 7 to 15 are front elevations of other different embodiments of the invention.

DESCRIPTION OF THE PREFERRED EMBODIMENT

The present invention will be described hereinafter in detail with reference to appended drawings showing different embodiments.

Figure 1:
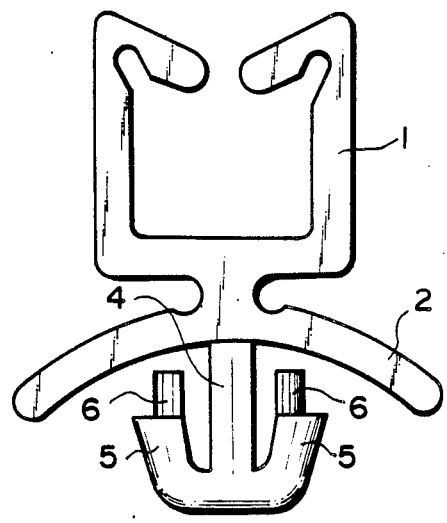
FIG. 1 is a front elevation of a conventional fixing component.
Figure 2:
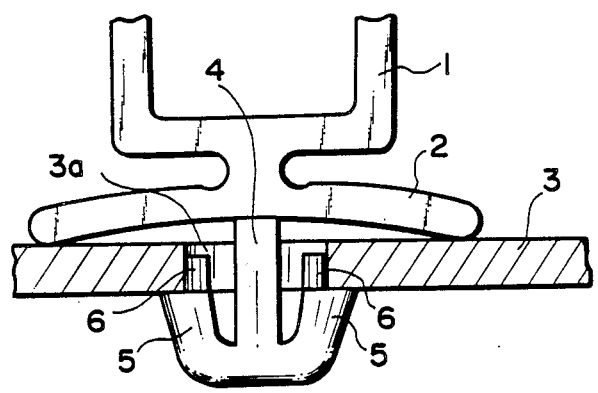
FIG. 2 is a front elevation showing this fixing component perpendicularly held to the circuit board in the hole thereof.
Figure 3:
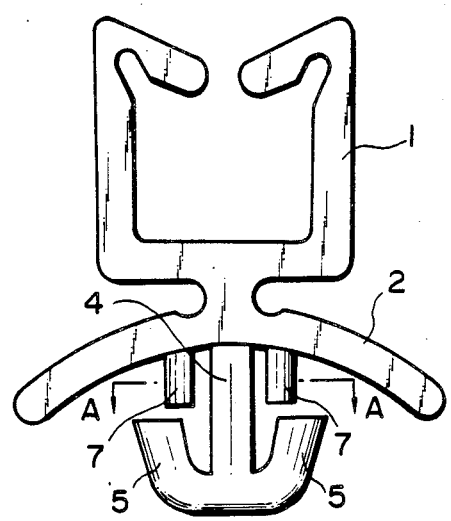
FIG. 3 is a front elevation of one preferred embodiment of the invention.
Figure 4:
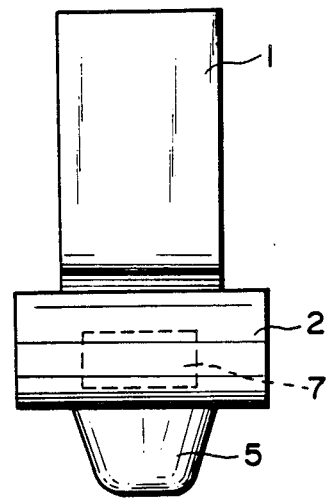
FIG. 4 is a side elevation of FIG. 3.
Figure 5:
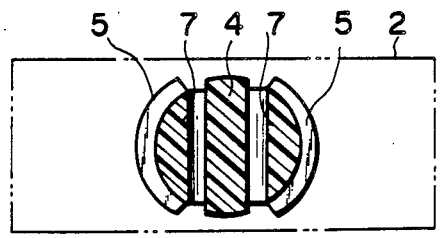
FIG. 5 is a transverse cross section taken along the line A—A of FIG. 3.

In FIGS. 3 to 5, the fixing component is formed with a synthetic resin material such as nylon, etc. That is, a reference numeral 1 denotes a holder portion which is formed such as to bundle and hold wires and integrally connected to an arch-shaped resilient seat portion 2. A column portion 4 extending from the central position on the resilient seat portion and formed integrally therewith is provided with a pair of resilient wing portions 5 diverging from a free end of the column portion toward the resilient seat portion. A pair of extensions 7 extending from desirable positions on the arch-shaped resilient seat portion is formed integrally therewith.

Figure 6:
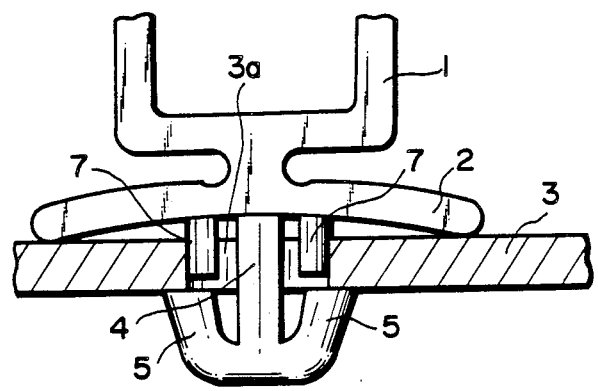
FIG. 6 is a front elevation showing the fixing component of FIG. 3 perpendicularly held to the circuit board in the hole thereof.
Figure 11:
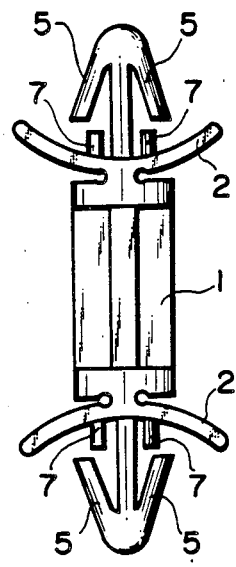
Figure 12:
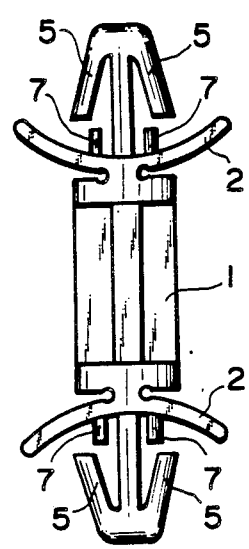
Figure 13:
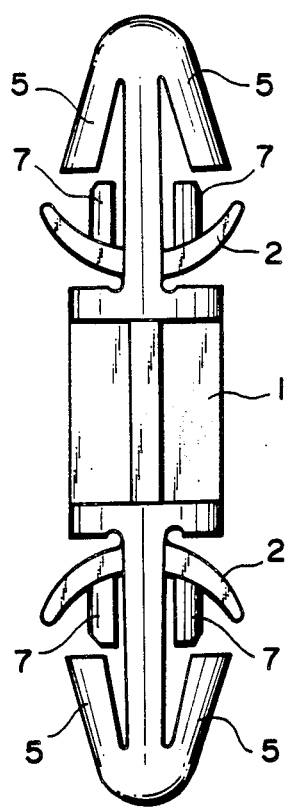

FIG. 6 shows the above fixing component perpendicularly held to the circuit board in the hole thereof. Free ends of the wing portions 5 are pressed against the reverse surface of the circuit board, while free ends of the arch-shaped resilient seat portion 2 are pressed against the surface of the circuit board, and the pair of extensions 7 extending from the seat portion 2 are pressed against the inner peripheral surface of the circular hole 3a.

In the above constitution according to the invention, as the arch-shaped resilient seat portion 2 is opened or stretched, the extensions 7 extending therefrom are expanded outwards and pressed to or brought into contact with the inner peripheral surface of the circular hole 3a. Accordingly, in the fixing component having such extensions pressing and contacting the circular hole of the circuit board, even if some side external force acts on the holder portion 4, the holder portion does not shift sidewards by virture of the occurrence of spring force against the side external force. Thus, this arrangement ensures the improvement in stability of fixing components.

FIGS. 7 to 10 show other embodiments of the fixing components for bundling in wiring according to the invention. FIGS. 11 to 15 show the fixing components for spacing printed circuit boards etc. according to the invention. Descriptions of the fixing components shown in these figures are omitted because they have constitutions which are equal to that of the embodiment described above.

According to the present invention, as described above, a fixing component is provided which comprises a holder portion having a shape suitable for holding components, a web-like resilient seat portion connected to the holder portion, curved toward the surface of an apertured circuit board to form an arch and provided with opposite free ends contacting the surface of the circuit board, a column portion projecting from the center of the seat portion through a hole in the circuit board, and a pair of resilient wing portions having free ends and diverging from a free end of the column portion toward the out side of the hole in the circuit board, wherein extensions contacting the inner peripheral surface of the hole of the circuit board are provided on the arch-shaped resilient seat portion so as to prevent the fixing component from shifting sidewards when influenced by a side external force. Thus, the fixing component highly improved in stability is provided.

What is claimed is:

1. A fixing component comprising a holder portion having a shape suitable for holding other components, a web-like resilient seat portion connected to said holder portion and curved toward the surface of an apertured circuit board to form an arch and provided with opposite free ends for contacting said surface of said circuit board, a column portion projecting from the center of said seat portion through a hole in said circuit board, and a pair of resilient wing portions having free ends and diverging from a free end of said column portion toward the outside of said hole in said circuit board, wherein a pair of extensions are provided on said arch-shaped resilient seat portion and are biased into engagement with an inner peripheral surface of said hole by said resilient seat portion upon flexing thereof and connection of said fixing component to said circuit board.

2. In a holder connectable to a substrate in order to provide attachment between said substrate and a component, said holder comprising a web-like seat portion engageable with said substrate during connection of said holder to said substrate, said seat portion being curved to provide a resilient arch with opposite ends, and a column portion projecting from a center of said seat portion so as to be insertable into a hole in said substrate and having a pair of resilient wing portions diverging from a free end of said column portion so as to engage a bottom side of said substrate upon insertion of said wing portions through said hole from a top side of said substrate such that said substrate is captured between said wing portions and said arch ends under influence of a spring bias provided by flexing of said resilient arch, the improvement comprising:

means for preventing sideways shifting of said holder in said hole upon connection thereof to said substrate, and comprising members extending from said arch into said hole and urged into engagement with an inner peripheral surface of said hole by said spring bias.

3. The improvement as in claim 2, and further comprising:

portions of said extending members which engage said inner peripheral surface being shaped to generally conform with said surface.

4. The improvement as in claim 3, wherein said inner peripheral surface is curved.

* * * * *